United States Patent [19]
Nakamiya et al.

[11] Patent Number: 6,166,609
[45] Date of Patent: *Dec. 26, 2000

[54] OSCILLATOR CIRCUIT SUPPLIED WITH OPTIMAL POWER VOLTAGE ACCORDING TO OSCILLATOR OUTPUT

[75] Inventors: Shinji Nakamiya; Tadao Kadowaki; Yoshiki Makiuchi, all of Suwa, Japan

[73] Assignee: Seiko Epson Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/056,799

[22] Filed: Apr. 8, 1998

[30] Foreign Application Priority Data

Apr. 14, 1997 [JP] Japan ...................................... 9-111835

[51] Int. Cl.[7] .................................. H03B 5/36; H03L 5/00
[52] U.S. Cl. ..................................... 331/109; 331/116 FE; 331/158; 331/183; 331/186
[58] Field of Search ....................... 331/116 R, 116 FE, 331/158, 109, 183, 185, 186

[56] References Cited

U.S. PATENT DOCUMENTS 3,213,390  10/1965  Faith et al. ............................... 331/109
5,719,534  2/1998  Imura ....................................... 331/158

FOREIGN PATENT DOCUMENTS

| 2 461 395 | 1/1981 | France . |
| 55-28632 | 2/1980 | Japan . |
| 57-46186 | 3/1982 | Japan . |
| 57-108689 | 7/1982 | Japan . |
| 58-47285 | 3/1983 | Japan . |
| 3-252206 | 11/1991 | Japan . |

*Primary Examiner*—Siegfried H. Grimm
*Attorney, Agent, or Firm*—Oliff & Berridge, PLC

[57] ABSTRACT

A crystal oscillation circuit that is capable of operating stably with a low power consumption includes a signal inversion amplifier and a power control circuit that controls the power voltage of this signal inversion amplifier in accordance with an oscillation output. The power control circuit includes a power voltage generation circuit that outputs a plurality of power voltages of different values; a determination control portion that determines the optimal value of the power voltage to be applied to the signal inversion amplifier, based on the oscillation output; and a multiplexer that controls the switching of the power voltage applied to the signal inversion amplifier from the power voltage generation circuit, based on the result of that determination.

19 Claims, 4 Drawing Sheets

OSCILLATOR CIRCUIT SUPPLIED WITH OPTIMAL POWER VOLTAGE ACCORDING TO OSCILLATOR OUTPUT

BACKGROUND OF THE INVENTION

1. Field of the Invention

This invention relates to an oscillation circuit, an electronic circuit using that oscillation circuit, and a semiconductor device, electronic equipment, and timepiece using that oscillation circuit or electronic circuit.

2. Description of Related Art

Oscillation circuits that use crystal oscillators are widely employed in the art in devices such as portable timepieces, portable telephones, and computer terminals. It is necessary to design such portable items of electronic equipment in such a manner that they have reduced power consumptions and longer battery lives.

From the viewpoint of reducing power consumptions, the present inventors have analyzed the power consumptions of electronic circuitry used in portable items of electronic equipment, particularly wristwatches. It has been determined by this analysis that a crystal oscillation circuit consumes a larger proportion of the power consumption than other parts of electronic circuitry formed on a semiconductor substrate. In other words, reducing the power consumption of the oscillation circuit within electronic circuitry used in portable electronic equipment will be an effective method of increasing the lifetime of the battery used therein.

If a voltage $V_{reg}$ is applied to a signal inversion amplifier in such a crystal oscillation circuit, the output of the signal inversion amplifier is inverted in phase by 180 degrees and is fed back and input to the gate thereof. This drives a pair of transistors that form the signal inversion amplifier to turn on and off alternately, the oscillation output of the crystal oscillation circuit gradually increases, until finally the crystal oscillator achieves a stable oscillation.

However, after this stable oscillation has been reached, only a small amount of energy is necessary in comparison with that required for activation, to compensate for losses in inertial energy in the crystal oscillator and thus maintain the oscillation.

In addition, different amounts of energy may be necessary for stable oscillation, even in circuits produced to the same standards, because of variations in the capabilities of signal inversion amplifiers that occur during mass production.

In spite of this, each conventional crystal oscillation circuit is configured in such a manner that the above pair of transistors are always driven alternately on and off at fixed voltages, during activation and also after stable oscillation is achieved. This is a major cause of increased power consumption of the entire circuit.

SUMMARY OF THE INVENTION

An objective of this invention is to provide a crystal oscillation circuit that is capable of oscillating stably with a low power consumption, an electronic circuit that uses the same, and a semiconductor device, electronic equipment, and timepiece that use the same.

In order to achieve the above objective, there is provided an oscillation circuit in accordance with the first aspect of the invention, comprising:

a signal inversion amplifier; and power control means for controlling the power voltage to be supplied to the signal inversion amplifier in accordance with an oscillation output.

This makes it possible to reduce the power consumption of the circuit during stable oscillation.

The above power control means may comprise:

a power circuit for outputting a plurality of power voltages of different values;

determination control means for determining an optimal value of the power voltage to be supplied to the signal inversion amplifier, based on the oscillation output; and switching means for controlling the switching of the power voltage to be supplied from the power circuit to the signal inversion amplifier, based on the determination result of the determination control means.

This configuration makes it possible to determine the optimal value of the power voltage to be applied to the signal inversion amplifier, based on the oscillation output of the oscillation circuit. Thus, the switching of the power voltage to be applied from the power circuit to the signal inversion amplifier is controlled on the basis of the result of this determination.

This ensures that, if the oscillation output of the oscillation circuit should fluctuate for some reason, or if there are variations in the capabilities of different signal inversion amplifiers, the optimal power voltage can be always supplied to the signal inversion amplifier, making it possible to maintain stable oscillation and reduce the power consumption.

This power control means may further comprise a plurality of inverters set to logic levels of different values for comparing the voltage of the oscillation output with the logic levels to output corresponding pulse signals;

the determination control means may determine an optimal voltage and output a power voltage selection instruction, based on values of the pulse signals output from the plurality of inverters; and the switching means may perform switching control of the power voltage to be supplied from the power circuit to the signal inversion amplifier, based on the power voltage selection instruction.

With this configuration, the oscillation output voltage of the oscillation circuit is compared by the plurality of inverters with logic levels of different voltages, and pulse signals are output.

Therefore, the determination control means can determine the optimal power voltage for the oscillation output, based on the values of the pulse signals that are output by the inverters, and thus the power voltage to be applied to the signal inversion amplifier can be switched and controlled to the optimal value.

The power control means may also comprise a power-supply switching element provided in a power supply line to the signal inversion amplifier, for providing on/off control, based on an output from one of the plurality of inverters.

This configuration makes it possible to reduce the power consumption even further by on/off control of the power-supply switching element provided in the power supply line to the signal inversion amplifier, based on an output from one of the plurality of inverters. In such a case, the oscillation state of the oscillation circuit can be determined approximately, based on output pulses of the inverter used in the on/off control of the power-supply switching element and output pulses from the other inverters that are set to different logic levels.

When the power to be supplied to the signal inversion amplifier is controlled intermittently by the on/off control of the power-supply switching element to reduce the power consumption, it is not desirable from the reduced power consumption viewpoint for errors to occur such as unstable oscillation due to too little power caused by turning off the power-supply switching element for too long, or a too high power consumption caused by the element being turned on for too long.

With this invention, the oscillation state can be monitored in a crystal oscillation circuit of this type of intermittent drive and thus feedback control can be provided to ensure that the power supply is always at an appropriate voltage, by comparing the output from the inverter that outputs a pulse signal for on/off control of the power-supply switching element against the outputs from the other inverters that are set to different logic levels.

This makes it possible to maintain a more stable oscillation and implement a reduced power consumption.

The oscillation circuit of this invention may further comprise oscillation output correction means for correcting frequency fluctuations in the oscillation output during the control of the power voltage.

In a crystal oscillation circuit formed on a semiconductor substrate, it is common for the main circuit components formed integrally with the semiconductor substrate to be connected by input-output terminals to the crystal oscillator, which is provided separately from the semiconductor substrate. This means that an electrostatic protection circuit is provided on the input-output terminal side of the main circuit components, to protect those main circuit components from surge voltages introduced from the outside through the inputoutput terminals.

However, if switching control of the power voltage to be applied to the signal inversion amplifier is implemented as described above, to reduce the power consumption, the output impedance of the signal inversion amplifier can vary and also fluctuations can occur in the parasitic capacitance of the electrostatic protection circuit, which causes problems in that fluctuations occur in the oscillation frequency f of the oscillation circuit, even though such fluctuations are small.

Such fluctuations in the oscillation frequency of the oscillation circuit would cause problems in an electronic circuit in which the oscillation output of the oscillation circuit is used as a reference clock of a timepiece, such as a wristwatch, because it would impair the accurate timekeeping abilities thereof.

This invention employs a configuration that uses an oscillation output correction means to correct fluctuations in the frequency of the oscillation output, while the power voltage to be applied to the signal inversion amplifier is controlled.

This makes it possible to provide an oscillation circuit that maintains a stable oscillation, reduces the power consumption during this stable oscillation, and also makes it possible to create an accurate reference clock.

In this respect, the oscillation output correction means may comprise:
frequency division means for dividing an oscillation frequency; and
frequency-division control means for controlling the frequency division of the frequency division means, based on the value of the power voltage to be supplied from the power circuit to the signal inversion amplifier;
whereby frequency fluctuations in the oscillation output generated during the control of the power voltage can be corrected.

In other words, when the oscillation output of the oscillation circuit is output through the frequency division means, the frequency-division control means controls the frequency division of the frequency division means, based on the value of the power voltage to be applied to the signal inversion amplifier, and thus corrects fluctuations in the frequency of the oscillation output that are generated by the control of the power voltage.

This makes it possible to correct fluctuations in the frequency of the oscillation output, but with a simple circuit configuration.

In this respect, frequency-division control data may be previously set corresponding to the plurality of power voltages that are output from the power circuit; and
the frequency-division control means may control frequency division of the frequency division means, based on the frequency division control data corresponding to the power voltage to be supplied to the signal inversion amplifier.

This makes it possible to provide an oscillation output correction means that enables correction of fluctuations in the frequency of the oscillation output by an even simpler configuration, by previously setting frequency-division control data corresponding to a plurality of power voltages.

The oscillation circuit may further comprise a crystal oscillator having a large Q value.

This makes it possible to maintain a stable oscillation state at an even lower power consumption, after the oscillation has stabilized, by using a crystal oscillator that has a large Q value, which expresses the degree of ease with which it oscillates mechanically.

According to the second aspect of this invention, there is provided an electronic circuit comprising the above oscillation circuit.

According to the third aspect of this invention, there is provided a semiconductor device comprising the above oscillation circuit or electronic circuit.

According to the fourth aspect of this invention, there is provided electronic equipment comprising the above oscillation circuit or electronic circuit.

These aspects of the invention reduce the power consumption in electronic equipment such as portable telephone and portable computer terminals, making it possible to reduce the power consumption of internal batteries and secondary batteries thereof.

According to the fifth aspect of this invention, there is provided a timepiece comprising the above oscillation circuit or electronic circuit.

This makes it possible to implement a timepiece with a low power consumption and, as a result, makes it possible to design a timepiece that is compact overall because it uses a smaller battery, or has a longer lifetime when a battery of the same capacitance is used therefor.

DESCRIPTION OF PREFERRED EMBODIMENTS

Preferred embodiments of this invention are described below with reference to the accompanying drawings.

First Embodiment

Figure 1:
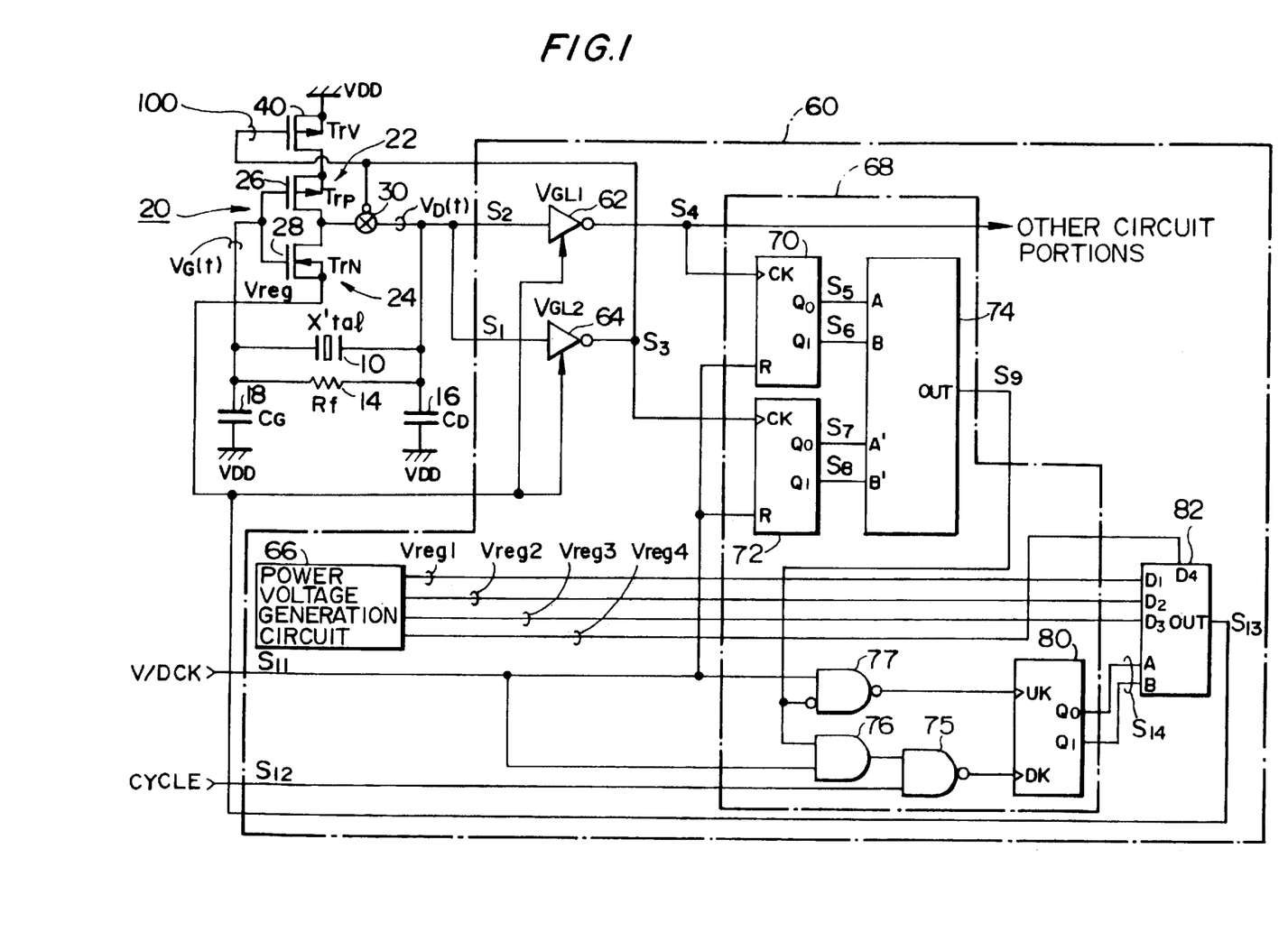
FIG. 1 is a circuit diagram of a first embodiment of the crystal oscillation circuit in accordance with this invention.
Figure 2:
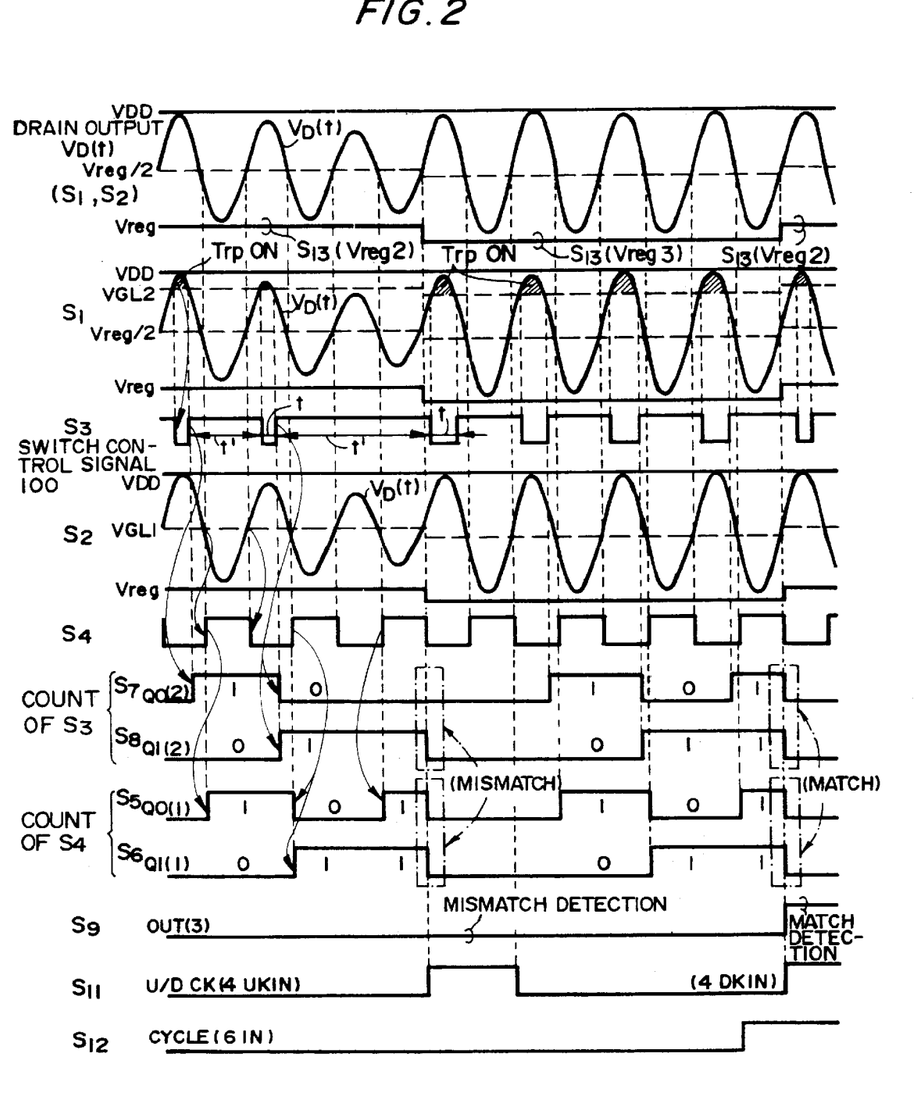
FIG. 2 is a timing chart of the circuit of FIG. 1.

A crystal oscillation circuit in accordance with a first preferred embodiment of this invention is shown in FIG. 1 and a timing chart thereof is shown in FIG. 2. The crystal oscillation circuit of this embodiment is a crystal oscillation circuit that is used in a quartz wristwatch and the main components of this circuit are formed on a semiconductor substrate.

The crystal oscillation circuit of this embodiment comprises a signal inversion amplifier 20 together with a crystal oscillator 10 and a resistor 14 that form a feedback circuit. This feedback circuit comprises phase-compensation capacitors 16 and 18, in addition to the crystal oscillator 10 and the resistor 14, and is designed to feed back to the signal inversion amplifier 20 an output $V_{D(t)}$ of the signal inversion amplifier 20 as a gate signal $V_{G(t)}$ that has had its phase inverted through 180 degrees.

The signal inversion amplifier 20 is connected to a first potential side and a second potential side of a lower voltage and is configured to be driven by power supplied by the potential difference between these two potentials. In this example, the first potential is set to a ground potential $V_{DD}$ and the second potential is set to a negative power voltage $V_{reg}$ that is supplied selectively from a power control circuit 60.

The signal inversion amplifier 20 comprises a first circuit 22 and a second circuit 24.

This first circuit 22 comprises a p-type field-effect transistor 26 that functions as a first semiconductor switching element. The source of this transistor 26 is connected to ground, the drain thereof is connected to an output terminal, and the feedback signal $V_{G(t)}$ is applied to the gate thereof.

The second circuit 24 comprises an n-type field-effect transistor 28 that functions as a second semiconductor switching element. The source of the transistor 28 is connected to the negative power voltage $V_{reg}$ supplied from the power control circuit 60, the drain thereof is connected to the output-terminal side (in this case, it is connected to the drain of the transistor 26), and the feedback signal $V_{G(t)}$ is applied to the gate thereof.

To enable the crystal oscillation circuit of this embodiment to control the turning on and off of the power supplied to the signal inversion amplifier 20 in synchronization with the output $V_{D(t)}$ thereof, it further comprises a field-effect transistor 40, which functions as a switching element for the power supply, and an inverter 64 that applies a switch control signal 100 to the gate of the transistor 40, based on the output $V_{D(t)}$ of the signal inversion amplifier 20.

This transistor 40 is configured by using a p-type field-effect transistor, where the source is connected to the ground potential $V_{DD}$ and the drain is connected to the source of the transistor 26.

The inverter 64 outputs a pulse signal $S_3$ that is low if the drain output voltage $V_{D(t)}$ that is input thereto as a signal $S_1$ is equal to or larger than a logic level $V_{GL2}$, or high if that input is less than that level, as shown in the timing chart of FIG. 2. This output $S_3$ is applied as a switch control signal 100 to the gate of the power-supply transistor 40 to control the turning on and off of the power-supply transistor 40 in synchronization with the output $V_{D(t)}$ of the signal inversion amplifier 20. This ensures that the power-supply transistor 40 is controlled to be on for a period t to supply power to the signal inversion amplifier 20 and off for a period t' to halt that power supply.

Thus the crystal oscillation circuit of this embodiment makes it possible to control the turning on and off of power to the signal inversion amplifier 20, reducing the power consumption.

In particular, this embodiment uses the output $V_{D(t)}$ of the signal inversion amplifier 20 to create the switch control signal 100 and control the turning on and off of the power supply automatically and at a suitable duty ratio, making it possible to design for a lower power consumption.

In this respect, it is preferable that the crystal oscillator 10 has a large Q value, which expresses the degree of ease with which it oscillates mechanically. This ensures that the crystal oscillator 10 has a large inertia (degree of free oscillation) so that even more stable oscillation thereof can be maintained, even when the signal inversion amplifier 20 is driven intermittently.

In this embodiment, the transistors 26 and 28 that configure the signal inversion amplifier 20 are formed by using enhancement-mode field-effect transistors and the threshold voltages thereof are set to be low. This makes it possible to reduce the absolute value of the power voltage $V_{reg}$ that is necessary for driving the signal inversion amplifier 20 stably, which enables a further reduction in the power consumption.

Note that if the threshold voltages of these transistors 26 and 28 are set to be small, the leakage currents thereof become too large when they are controlled to turn off. To solve that problem, a transistor with a high threshold voltage is used as the field-effect transistor 40 used for supplying power in this embodiment, which ensures a configuration such that the above described off-leakage current is reliably reduced.

This ensures that the signal inversion amplifier 20 can be driven by using a low power voltage $V_{reg}$ and moreover the off-leakage current can be reliably reduced, thus making it possible to implement a crystal oscillation circuit that has an even lower power consumption and which can oscillate stably. Note that the transistor 40 used as this power-supply semiconductor switching element preferably has a high degree of capability within the permissible range, to ensure that the on-state resistance thereof is small and the voltage drop therein is reduced.

The crystal oscillation circuit of this embodiment is also provided with a switching element 30 for blocking the output at the output stage of the signal inversion amplifier 20.

In the circuit shown in FIG. 1, it could happen that, for example, when the transistor 40 is controlled to turn off, the transistor 28 configuring the signal inversion amplifier 20 goes on and the crystal oscillator 10 is pulled down to a low potential ($V_{reg}$ level), so that the oscillation is suppressed.

That is why the output-blocking switching element 30 is provided in the output stage of the signal inversion amplifier 20 of this embodiment so that, when the transistor 40 is controlled to be off, this output-blocking switching element 30 is also used to provide off-control. This makes it possible for the crystal oscillator 10 to switch from the circuit of the signal inversion amplifier 20 and oscillate freely when the transistor 40 is controlled to turn off.

As a result, the crystal oscillation circuit of this embodiment ensures that the oscillation circuit can operate more stably when the signal inversion amplifier 20 is being driven intermittently by the switch 40. In this respect, it is preferable that a transmission gate or the like is used as the output-blocking switching element 30.

The power control circuit 60 of this embodiment is also configured in such a manner that it enables the continuation of a more stable oscillation and also a reduced power consumption, by selecting an appropriate power voltage $V_{reg}$ from a plurality of different power voltages $V_{reg}1$, $V_{reg}2$, ... $V_{reg}4$, based on the value of the output voltage VD(t) of the signal inversion amplifier 20, and applying it to the signal inversion amplifier 20.

This configuration is described below.

The power control circuit 60 of this embodiment comprises a power voltage generation circuit 66 that outputs a plurality of different power voltages $V_{reg}1, V_{reg}2, \ldots V_{reg}4$; a multiplexer 82 that selects and outputs one of these power voltages $V_{reg}$; inverters 64 and 62; and a determination control portion 68 that determines the oscillation state of the circuitry, based on the outputs $S_3$ and $S_4$ of the inverters 64 and 62, and controls the power voltage selected by the multiplexer 82.

The power voltage $V_{reg}$ selected by the multiplexer 82 (indicated as a signal $S_{13}$ in the figure) is applied to the signal inversion amplifier 20 (in this case, to the source side of the transistor 28).

The output $V_{D(t)}$ of the signal inversion amplifier 20 is input to the inverter 64 and the inverter 62 as the signal $S_1$ and a signal $S_2$, respectively.

This inverter 64 outputs the pulse signal $S_3$ which is low when the drain output voltage $V_{D(t)}$ is equal to or larger than the predetermined logic level $V_{GL2}$ and high when it is below that level, as shown in the timing chart of FIG. 2. This output $S_3$ is input to a CK terminal of a counter 72 and is also applied to the gate of the transistor 40 as the switch control signal 100.

A logic level $V_{GL1}$ of the inverter 62 is set to be $V_{reg}/2$. The drain output $V_{D(t)}$ is input to the inverter 62 as the signal $S_2$ shown in FIG. 2, and the inverter 62 outputs to a CK terminal of a counter 70 a pulse signal $S_4$ which is low when the drain output $V_{D(t)}$ is equal to or larger than this logic level $V_{GL1}$ and high when it is below that level.

The determination control portion 68 controls the multiplexer 82 in such a manner that the power voltage $V_{reg}$ is selected in accordance with the drain output $V_{D(t)}$ that is output from the signal inversion amplifier 20, based on the pulse signals $S_3$ and $S_4$ that are input thereto, and applies the selected power voltage $V_{reg}$ to the signal inversion amplifier 20.

This makes it possible to control the value of the power voltage $V_{reg}$ applied to the signal inversion amplifier 20 to the necessary minimum level that enables stable oscillation to continue.

The description now turns to details of the configuration of the power control circuit 60.

The determination control portion 68 comprises counters 70 and 72; a matching detection circuit 74; gates 75, 76, and 77; and an up/down counter 80.

An up/down clock signal is input to reset terminals R of the counters 70 and 72 and one terminal each of the gates 76 and 77 as a signal $S_{11}$. This up/down clock signal becomes a high-level signal in the ratio of once every four cycles of the oscillation output.

A cycle clock signal $S_{12}$ is input to the gate 75. This signal $S_{12}$ outputs a high-level signal in the ratio of once every six cycles of the oscillation output.

The operation of the power control circuit 60 will now be described with reference to the timing chart of FIG. 2.

First of all, when the drain output $V_{D(t)}$ of the signal inversion amplifier 20 is input as the signals $S_1$ and $S_2$ to the inverters 64 and 62, the inverter 64 outputs the low-level pulse signal $S_3$ every time the signal $S_1$ is equal to or larger than the logic level $V_{GL2}$ and the inverter 62 outputs the low-level pulse signal $S_4$ every time the input signal $S_2$ is equal to or larger than the predetermined logic level ($V_{reg}/2$).

The determination control portion 68 compares these two pulse signals $S_3$ and $S_4$, determines the oscillation state of the oscillation circuit, and controls the switching of the power voltage $V_{reg}$ selected by the multiplexer 82.

More specifically, the output pulses $S_4$ from the inverter 62 are counted by the counter 70 and the output pulses $S_3$ are counted by the counter 72, and signals $S_5, S_6, S_7$, and $S_8$ that express the counts of the counters 70 and 72 are input to the matching detection circuit 74. Note that the counts of the two counters 70 and 72 are reset periodically by the up/down clock signal $S_{11}$ that is input in the ratio of once every four cycles.

The matching detection circuit 74 outputs a high-level matching detection signal $S_9$ when the counts of the two counters 70 and 72 match, or a low-level non-matching detection signal $S_9$ when they do not match.

This output signal $S_9$ of the matching detection circuit 74 functions as a gate signal that opens the gates 77, 76, and 75. When the output $S_9$ is high, the up/down clock signal $S_{11}$ is input to a down-count terminal DK of the up/down counter 80 on condition that the cycle clock signal $S_{12}$ is high; when the output $S_9$ is low, the up/down clock signal $S_{11}$ is input to an up-count terminal UK of the up/down counter 80.

The up/down counter 80 increments a count in accordance with the signal that is input to the up-count terminal UK thereof or decrements the count in accordance with the signal that is input to the down-count terminal DK thereof, and inputs this count $Q_0$ and $Q_1$ to control signal input terminals A and B of the multiplexer 82 as a power voltage control signal $S_{14}$. In this case, the combined output $Q_0$ and $Q_1$ of the up/down counter 80 is in one of the four states 00, 01, 10, or 11, and thus the multiplexer 82 selects one of the four power voltages in accordance with that state and outputs it as the power voltage $V_{reg}$ to the signal inversion amplifier 20.

If the number of output pulses $S_4$ from the inverter 62 is less than the number of output pulses $S_3$ from the inverter 64, the matching detection circuit 74 of this embodiment determines that the oscillation is unstable, opens the gate 77, and thus the up/down clock signal $S_{11}$ is input to the up-count terminal UK of the up/down counter 80. As a result, the outputs $Q_0$ and $Q_1$ of the up/down counter 80 control the multiplexer 82 in such a manner that it selects a power voltage $V_{reg}$ that is one higher than the current selection. This increases the voltage of the drain output $V_{D(t)}$ that is output from the signal inversion amplifier 20, making it possible to maintain a stable oscillation.

If the counts of the two counters 70 and 72 match, in other words, if the numbers of output pulses from the two inverters 62 and 64 are the same, the matching detection circuit 74 determines that the oscillation is stable and closes the gate 77 and opens the gate 76. This causes the gate 75 to open if the cycle clock signal $S_{12}$ is high, to input the up/down clock signal $S_{11}$ to the down-count terminal DK of the up/down counter 80. As a result, the outputs $Q_0$ and $Q_1$ of the up/down counter 80 control the multiplexer 82 so that it selects a power voltage $V_{reg}$ that is one lower than the current selection. This reduces the power voltage applied to the signal inversion amplifier 20, making it possible to reduce the power consumption.

It is therefore possible to control the crystal oscillation circuit in such a manner that an appropriate amount of power is always applied thereto, by using a configuration in which a power voltage $V_{reg}$ is selected in accordance with the drain output $V_{D(t)}$ from the signal inversion amplifier 20.

In particular, this embodiment makes it possible to provide optimal power supply control and thus design for a reduced power consumption, without any effects due to variations in capability of the signal inversion amplifier 20 (such as current amplification ratio or threshold voltage) that may occur during mass production.

In other words, the power voltage $V_{reg}$ is set to be low if the capabilities of the signal inversion amplifier 20 are high. In such a case, the high level of capabilities of the signal inversion amplifier 20 ensure that the oscillation stability thereof is high from the start. Therefore, stable oscillation can be maintained even if the power supply from the power source is reduced, making it possible to reduce the power consumption.

If the capabilities of the signal inversion amplifier 20 are low, a high value is set for the power voltage $V_{reg}$. This ensures that a sufficient power supply is provided even when a signal inversion amplifier 20 with low capabilities is used, making it possible to improve the oscillation stability.

Second Embodiment

Figure 3:
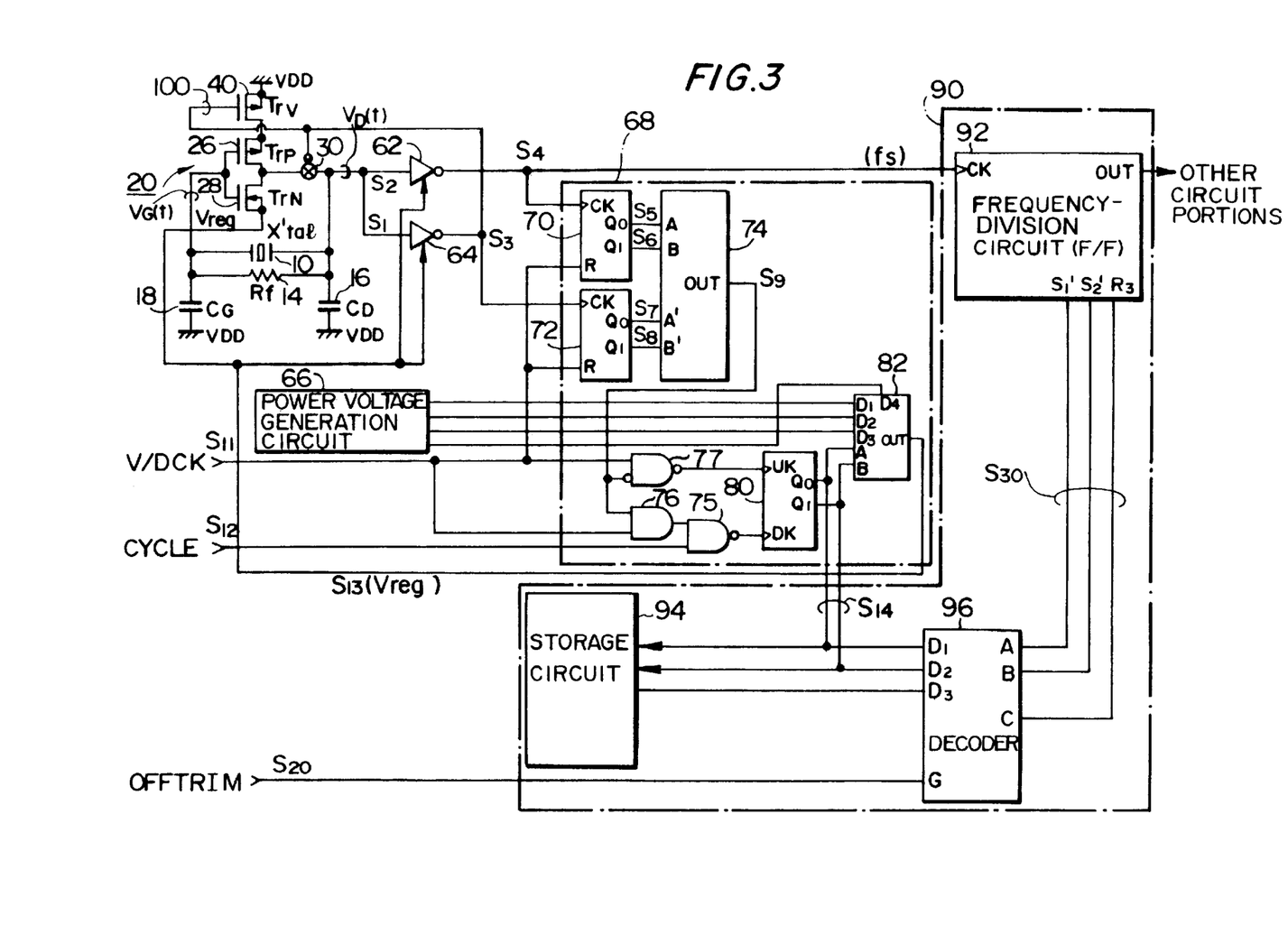
FIG. 3 is a circuit diagram of a second embodiment of this invention.
Figure 4:
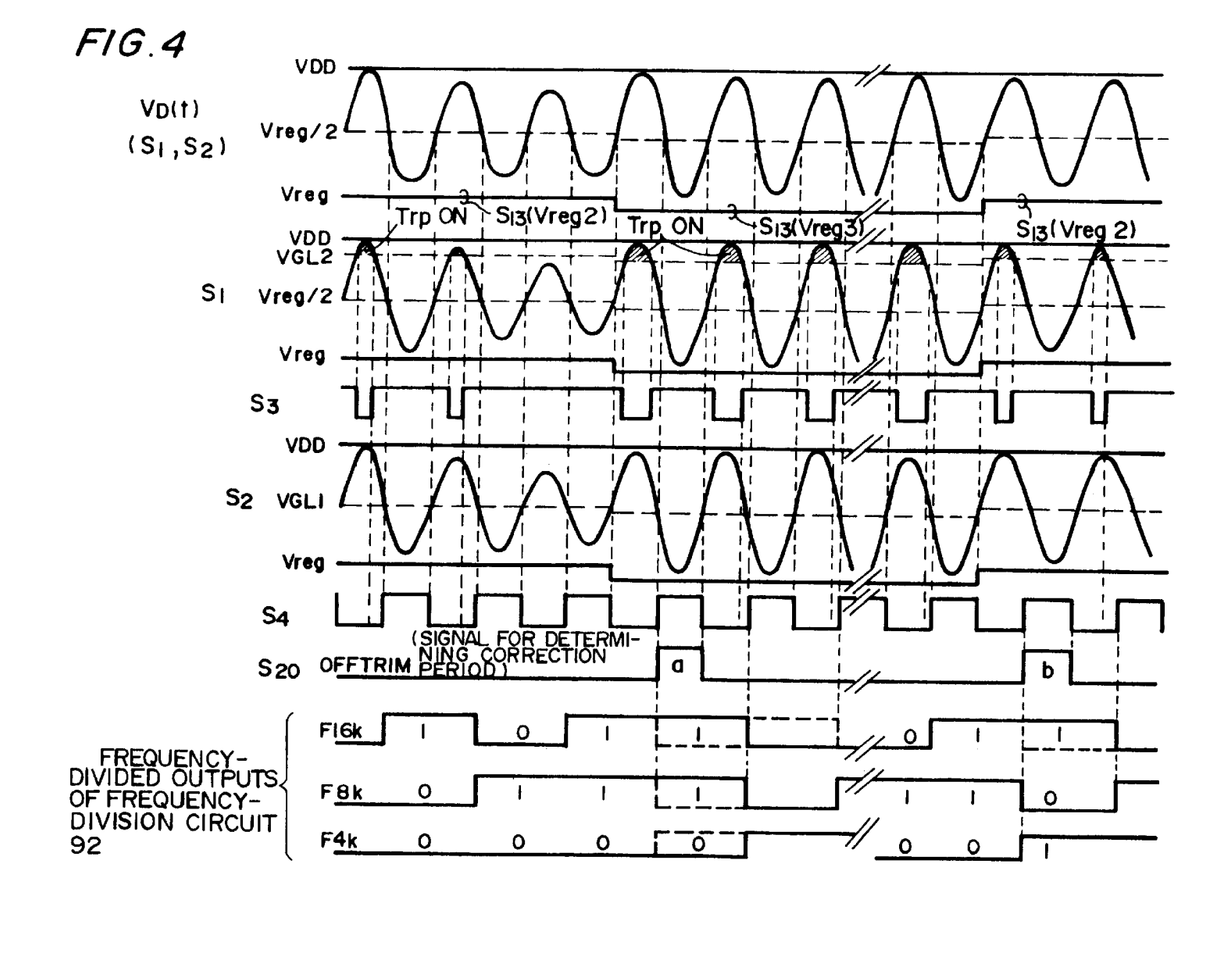
FIG. 4 is a timing chart of the circuit of FIG. 3.

A second embodiment of the crystal oscillation circuit of this invention is shown in FIG. 3 and a timing chart thereof is shown in FIG. 4. Note that components that are similar to those of the first embodiment are denoted by the same reference numbers and further description thereof is omitted.

This embodiment is characterized in that it is provided with an oscillation output correction circuit 90 for correcting frequency fluctuations in the oscillation output that are generated when switching control is performed on the power voltage $V_{reg}$ applied to the signal inversion amplifier 20.

This oscillation output correction circuit 90 comprises a frequency-division circuit 92 that outputs a signal that is divided from the frequency fs of the oscillation output $S_4$ that is output though the inverter 62; and a storage circuit 94 and decoder 96 that provide frequency-division control for the frequency-division circuit 92, based on the value of the power voltage $V_{reg}$ applied from the power control circuit 60 to the signal inversion amplifier 20. In this case, the storage circuit 94 and the decoder 96 function as frequency-division control means.

That is to say, if the power voltage applied to the crystal oscillation circuit changes, there will be changes in the output impedance of the signal inversion amplifier 20 and the parasitic capacitance of an electrostatic protection circuit appended to the gate and drain terminals thereof.

More specifically, if the power voltage $V_{reg}$ should increase, the output impedance of the signal inversion amplifier 20 will decrease and the parasitic capacitance of the electrostatic protection circuit will also decrease, resulting in an increase in the oscillation frequency fs of the oscillation circuit.

Conversely, if the power voltage $V_{reg}$ should decrease, the opposite process to that described above will result in a fall in the oscillation frequency fs of the oscillation circuit.

To ensure that the reference oscillation frequency of the crystal oscillation circuit of this embodiment is set to be fs=32768 Hz, it is necessary to provide frequency correction in such a manner that the oscillation frequency thereof does not vary from the reference oscillation frequency, even if there are fluctuations in the power voltage $V_{reg}$.

Such frequency correction is extremely important when this crystal oscillation circuit is used to obtain a reference oscillation frequency for a device such as a timepiece in particular.

This embodiment is characterized in that, if there are fluctuations in the power voltage $V_{reg}$ caused by the switching control of the power control circuit 60, the oscillation frequency of the oscillation circuit itself is not adjusted but the frequency-division circuit 92 in the next stage is used to correct the frequency-divided signal (the signal of 16 kHz).

More specifically, if the power voltage $V_{reg}$ increases, the signal divided by the frequency-division circuit 92 is corrected in the slower direction; if the power voltage $V_{reg}$ falls, the frequency-division signal is corrected in the faster direction.

The specific configuration thereof is described below.

First of all, the oscillation output $S_4$ that is output through the inverter 62 is input to a CK terminal of the frequency-division circuit 92. This causes the frequency-division circuit 92 to divide the reference oscillation frequency fs of the oscillation output $S_4$ and output the thus-divided signal to the other circuit components.

A ½ frequency-divided output, ¼ frequency-divided output, and ⅛ frequency-divided output obtained by the usual frequency-division operation are denoted in FIG. 4 by F16k, F8k, and F4k.

In this embodiment, the frequency correction provided by using the frequency-division circuit 92 is done by a known technique called a logical regulator.

In addition to the above ½, 1/4, and ⅛ frequency-division operations, this frequency-division circuit 92 performs the frequency division to obtain the final 1-Hz signal, but, to simplify the description herein, the discussion below concerns only the above three ½, 1/4, and ⅛ frequency-division operations and the corresponding processing for frequency correction that uses the logical regulator technique.

To perform the previously described logical regulator frequency correction, the frequency-division circuit 92 is provided with set terminals $S_1'$ and $S_2'$ for the ½ and ¼ frequency division and a reset terminal $R_3$ for the ⅛ frequency division. For correction in the faster direction, a reset signal 0 could be input to the uppermost reset terminal $R_3$, and for correction in the slower direction, a reset signal 1 could be input to the uppermost reset terminal $R_3$. The amounts of correction in the faster and slower directions could be input as signals corresponding to those amounts of correction, to the lower set terminals $S_2'$ and $S_1'$.

With this embodiment, four power voltages $V_{reg}1$, $V_{reg}2, \ldots V_{reg}4$ are output from the power voltage generation circuit 66, and these are used selectively as the power voltage for the signal inversion amplifier 20. The frequency corrections in the faster direction and the slower direction are done by the frequency-division circuit 92 in accordance with these four voltages.

Amounts of frequency correction corresponding to each of these four power voltages have been stored beforehand as frequency-division control data in the storage circuit 94. The decoder 96 reads out frequency-division control data corresponding to the power voltage $V_{reg}$ to be selected and output, based on the power voltage control instruction $S_{14}$ that is output from the up/down counter 80, and outputs it as a frequency-division control signal $S_{30}$ to the terminals $S_1'$, $S_2'$, and $R_3$ of the frequency-division circuit 92.

In other words, this frequency-division control data is previously stored in the storage circuit 94 during the process of forming the circuitry of FIG. 3 as IC circuits on the semiconductor substrate. More specifically, the IC is put into test mode during the IC inspection stage, and the oscillation frequency fs that is generated when the four power voltages $V_{reg}1$ to $V_{reg}4$ are switched sequentially and applied to the signal inversion amplifier 20 are each measured. The amount of departure of oscillation frequency with respect to the reference frequency of 32768 Hz is then determined.

Frequency-division control data for correcting this oscillation frequency departure data is then written to the storage circuit 94. In particular, this makes it possible to output an accurate reference signal from the frequency-division circuit 92 to correspond to variations in the constants of the crystal oscillation circuit that occur during the mass production of ICs, by performing measurements during the testing of each IC and writing appropriate frequency-division control data to the storage circuit 94.

In this case, the four different power voltages are specified by the 2-bit data signal $Q_0$ and $Q_1$ that is output from the up/down counter 80 as the signal $S_{14}$.

Frequency-division control data corresponding to the four different power voltages specified by this 2-bit data is therefore stored as 3-bit data that is supplied to the terminals $S_1'$, $S_2'$, and $R_3$ of the frequency-division circuit 92. Note that this storage circuit 94 could be configured by using EEPROM, a fuse-cut type of memory, EPROM, PROM, DRAM, SRAM, flash memory, ferroelectric memory, or the like, as necessary.

A signal $S_{20}$ that determines the frequency correction period is also input to the decoder 96. In this embodiment, this signal $S_{20}$ inputs pulses a, b, ... at a ratio of once every predetermined cycle of the oscillation frequency.

The decoder 96 reads the frequency-division control data corresponding to the power voltage from the storage circuit 94 in synchronization with this signal $S_{20}$ and outputs it as the frequency-division control signal $S_{30}$.

If, as shown for example in FIG. 4, the pulses that form the signal $S_{20}$ are input at the timing of the pulse a while the frequency-division circuit 92 is performing the frequency-division operation, the decoder 96 calls the frequency-division control data corresponding to the power voltage from the storage circuit 94 at the same timing, and outputs it to the frequency-division circuit 92. In this case, signals $S_1'=1$, $S_2'=1$, and $R_3=1$ are output as the frequency-division control signal $S_{30}$.

This changes the frequency-divided outputs F16k, F8k, and F4k of the frequency-division circuit 92 from their original values of 0, 0, and 1, as shown by broken lines in the figure, to 1, 1, and 0, as shown by solid lines in the figure, applying a correction of one cycle of the oscillation frequency 32 kHz in the slower direction to the frequency-divided output. This determines that the power voltage has increased and the oscillation frequency has also increased, so the frequency is corrected in the slower direction by the frequency-division circuit 92.

In addition, if the signal $S_{20}$ that determines the correction period is input to the decoder 96 at the timing of the pulse b, signals $S_1'=1$, $S_2'=0$, and $R_3=0$ are output as the frequency-division control signal $S_{30}$ corresponding to the power voltage.

This ensures that the frequency-division circuit 92, which is performing the frequency-division operation shown by broken lines in the figure, corrects the ½ frequency-divided output F16k in the faster direction by one cycle of the oscillation frequency 32 kHz, as shown by the solid lines. This determines that the power voltage has fallen and the oscillation frequency has also fallen, so the frequency is corrected in the faster direction by the frequency-division circuit 92.

In this manner, the oscillation output correction circuit 90 of this embodiment makes it possible to create a signal of an accurate reference frequency with a simple circuit, by using the frequency-division circuit 92 to correct for any frequency departure created by the switching control performed on the power voltage of the signal inversion amplifier 20.

Note that this invention is not limited to the above embodiments; it can be modified in various ways within the scope of the invention set out herein.

For example, the above embodiments were described by way of example as having a signal inversion amplifier 20 formed of the first and second circuits 22 and 24, where one each of the transistors 26 and 28 were used therein, but it is perfectly possible to configure the circuitry of combinations of elements other than those described above, if necessary, without losing the functions of the first and second circuits 22 and 24.

In addition, the above embodiment was described as using a correction circuit 90 employing a logical regulator method as the oscillation output correction means, by way of example, but the present invention is not limited thereto and other correction means can be used therefor if necessary.

For example, the configuration could be such that the capacitance of a phase-compensation capacitor of the crystal oscillation circuit could be controlled variably to correct the oscillation frequency itself.

More specifically, a number of oscillation frequency correction capacitors could be disposed within the IC, to be connected in parallel with the phase-compensation capacitor 18 connected to the gate side of the crystal oscillation circuit.

These oscillation frequency correction capacitors are selected by a capacitance selection circuit in accordance with the power voltage $V_{reg}$ of the crystal oscillation circuit, and are connected in parallel with the capacitor 18. This varies the phase-compensation gate capacitance of the crystal oscillation circuit, making it possible to correct the oscillation frequency.

This capacitance control of the phase-compensation capacitor is preferably performed by the capacitor 18 on the gate side, rather than the capacitor 16 on the drain side. If the drain capacitance is varied, only subtle correction of the oscillation frequency is possible and it would have a large effect on the current consumption of the oscillation circuit. In contrast thereto, if the gate capacitance is varied, there is not much effect on the current consumption of the oscillation circuit and the oscillation frequency itself can be largely corrected. Since the oscillation frequency can vary widely, particularly when the power voltage of the oscillation circuit is changed, controlling the variation of the gate capacitance is preferable.

Note that the determination of how much correction to apply to the oscillation frequency in accordance with the power voltage $V_{reg}$ (the amount of capacitance to be connected) is preferably done during the process of forming the IC, in a manner similar to the logical regulator method.

The above embodiments were also described herein as relating to the use of a crystal oscillation circuit in the electronic circuitry for a timepiece, by way of example, but the present invention should not be taken as being limited thereto. It would be extremely effective when used in a wide range of portable electronic equipment having limitations in the capacitance of the power source, such as in portable telephones, portable computer terminals, and other portable equipment.

What is claimed is:

1. An oscillation circuit comprising:
   a signal inversion amplifier; and
   a power control means for controlling the power voltage to be supplied to said signal inversion amplifier in accordance with an oscillation output after oscillation is stabilized, wherein said power control means comprises:

a power circuit for outputting a plurality of power voltages of different values;

determination control means for determining an optimal value of the power voltage to be supplied to said signal inversion amplifier, based on the oscillation output; and switching means for controlling the switching of the power voltage to be supplied from said power circuit to said signal inversion amplifier, based on the determination result of said determination control means.

2. The oscillation circuit as defined in claim 1, the oscillation circuit being a crystal oscillation circuit.

3. The oscillation circuit as defined in claim 1, wherein said power control means further comprises a plurality of inverters which are set to logic levels of different values for comparing the voltage of the oscillation output with said logic levels to output corresponding pulse signals;

wherein said determination control means determines an optimal voltage and outputs a power voltage selection instruction, based on values of said pulse signals output from said plurality of inverters; and wherein said switching means performs switching control of the power voltage to be supplied from said power circuit to said signal inversion amplifier, based on said power voltage selection instruction.

4. The oscillation circuit as defined in claim 3, wherein said power control means further comprises:

a power-supply switching element provided in a power supply line to said signal inversion amplifier, for providing on/off control, based on an output from one of said plurality of inverters.

5. The oscillation circuit as defined in claim 3, further comprising:

oscillation output correction means for correcting frequency fluctuations in the oscillation output during the control of the power voltage.

6. The oscillation circuit as defined in claim 1, further comprising:

oscillation output correction means for correcting frequency fluctuations in the oscillation output during the control of the power voltage.

7. The oscillation circuit as defined in claim 5, wherein said oscillation output correction means comprises:

frequency division means for dividing an oscillation frequency; and frequency-division control means for controlling the frequency division of said frequency division means, based on the value of the power voltage to be supplied from said power circuit to said signal inversion amplifier;

whereby frequency fluctuations in the oscillation output generated during the control of the power voltage are corrected.

8. The oscillation circuit as defined in claim 6, wherein said oscillation output correction means comprises:

frequency division means for dividing an oscillation frequency; and frequency-division control means for controlling the frequency division of said frequency division means, based on the value of the power voltage to be supplied from said power circuit to said signal inversion amplifier;

whereby frequency fluctuations in the oscillation output generated during the control of the power voltage are corrected.

9. The oscillation circuit as defined in claim 8, wherein frequency-division control data is previously set corresponding to said plurality of power voltages that are output from said power circuit; and wherein said frequency-division control means controls frequency division of said frequency division means, based on said frequency-division control data corresponding to the power voltage to be supplied to said signal inversion amplifier.

10. The oscillation circuit as defined in claim 1, further comprising a crystal oscillator having a large Q value.

11. An electronic circuit comprising the oscillation circuit as defined in claim 1.

12. A semiconductor device comprising the oscillation circuit as defined in claim 1.

13. Electronic equipment comprising the oscillation circuit as defined in claim 1.

14. A timepiece comprising the oscillation circuit as defined in claim 1.

15. A semiconductor device comprising the electronic circuit of claim 11.

16. Electronic equipment comprising the electronic circuit of claim 11.

17. A timepiece comprising the electronic circuit of claim 11.

18. An oscillation circuit comprising:

a signal inversion amplifier; and a power control circuit that controls the power voltage to be supplied to said signal inversion amplifier in accordance with an oscillation output after oscillation is stabilized, wherein said power control circuit comprises:

a power circuit for outputting a plurality of power voltages of different values;

a determination control portion that determines an optimal value of the power voltage to be supplied to said signal inversion amplifier, based on the oscillation output, and a switch portion that controls the switching of the power voltage to be supplied from said power circuit to said signal inversion amplifier, based on the determination result of said determination control portion.

19. A method for using an oscillation circuit comprising:

supplying a power voltage to a signal inversion amplifier in accordance with an oscillation output after oscillation is stabilized; and controlling the power voltage to be supplied to said signal inversion amplifier, wherein said power voltage controlling comprises:

outputting a plurality of power voltages of different values;

determining an optimal value of the power voltage to be supplied to said signal inversion amplifier, based on the oscillation output; and controlling the switching of the power voltage to be supplied to said signal inversion amplifier, based on the determination result.

* * * * *